United States Patent

Lederhandler et al.

[11] 4,000,437
[45] Dec. 28, 1976

[54] ELECTRIC DISPLAY DEVICE

[75] Inventors: Saul Lederhandler; Robert Maggio, both of Somerville; Winthrop Blythe, Newark, all of N.J.

[73] Assignee: Integrated Display Systems Incorporated, Edison, N.J.

[22] Filed: Dec. 17, 1975

[21] Appl. No.: 641,610

[52] U.S. Cl. .................. 313/500; 313/510; 313/512; 340/324 M; 357/17
[51] Int. Cl.² .................................. H01J 1/54
[58] Field of Search ............ 313/510, 500, 512; 357/17; 340/324 M

[56] References Cited

UNITED STATES PATENTS

| 3,289,198 | 11/1966 | Dickson, Jr. et al. | 340/324 |
|---|---|---|---|
| 3,869,637 | 3/1975 | Usui | 313/500 |
| 3,886,581 | 5/1973 | Katsumura | 335/17 |

*Primary Examiner*—Robert Segal
*Assistant Examiner*—Vincent J. Sunderdick
*Attorney, Agent, or Firm*—David S. Woronoff

[57] ABSTRACT

A solid state light emitting display device utilizing two light emitting elements displayed in a single channel having ends in which each element is disposed closer to the ends of the channel than to each other.

11 Claims, 4 Drawing Figures

ELECTRIC DISPLAY DEVICE

BACKGROUND OF THE INVENTION

The present invention relates to a novel structure for a solid state electronic display device. Such devices are utilized in the output displays for digital clocks, watches, calculators, small computers, copiers, ovens, volt meters, and a wide variety of other devices. Such devices frequently must be visible to the human eye at a distance and it is desirable to make the display of sizes larger than a half inch. In displays larger than one half inch it is necessary to employ more than one light emitting device per segment to achieve uniform illumination along the length of the segment. (A numerical display would typically have seven segments.)

Previously, when more than one active element, such as a light emitting diode, (L.E.D.) was used per segment it was common to place each L.E.D. in its own recess formed in an optical shroud or frame. The optical shroud was typically made of a black or other dark material to prevent light coupling between segments and to improve contrast ratio. The shroud was formed to have angled surfaces to reflect light and the segment wall surfaces of the shroud were made highly reflective. The front faces of the shroud were silvered or aluminized. The L.E.D. was bonded to a drive circuit by way of a printed circuit board or a ceramic substrate and a shroud was placed over the L.E.D. and the circuit board. An epoxy was placed on the L.E.D.'s and in the openings of the shroud and cured; thus bonding the circuit board and the shroud together. The epoxy had a refractive index approaching that of the L.E.D. and in between that of the L.E.D. and air.

Because each light source has its own recess it was necessary for the best visual result to center the light source in the recess. This centering made it more difficult to get equal brightness into the corners of the display and resulted in a hot spot at the segment center. Because the human eye cosmetically rejects the appearance of digits having reduced intensity at their segments ends than those having more brightly illuminated corners than their centers. This effect is more troublesome when two or more segments intersect. It is cosmetically more pleasing to view digits whose corners are equal to or are more brighter than the intensity at the center of the segments.

The curing of the epoxy during manufacture and the subsequent treatment of the assembly after curing may result in failures in the whole package. Because the epoxy enclosed and sealed the whole assembly it was not economically feasible to repair any assembly found defective after final testing. Therefore the entire assembly had to be discarded greatly raising the cost of the manufacturing of these assemblies.

The closest patent art which is known to the inventors are: Katsumura, U.S. Pat. No. 3,886,581, issued, May 27, 1975; Usui, U.S. Pat. No. 3,869,637, issued Mar. 4, 1975; and Groves, U.S. Pat. No. 3,889,147, issued June 10, 1975.

The Katsumura patent shows a number of L.E.D.'s glued to an electrically insulating board, junction exposed and arranged to define a display. One diode is used per segment and no shroud is shown.

The Usui patent shows a metal layer with windows which serve as display segments. The patent also shows a number of diodes larger than the number of windows and not in registry with the windows. It appears that the junction of each diode is positioned with respect to the structure so that light is transmitted to an associated window for defining a display segment. Although the patent shows more than one diode associated with a window, there is no direct registry between the window and the diodes and the window is the size of a diode.

The Groves patent shows a plurality of L.E.D. arrays potted in a single cavity. No shroud is shown or discussed.

SUMMARY OF THE INVENTION

The present invention consists of a novel combination of elements to form a new electronic display device. The basic building blocks are a printed circuit board, or other physical support, a plurality of light emitting elements, typically light emitting diodes, an optical shroud or frame, a refractive coating for the light emitting elements and a filter plate to fit over the shroud. When two or more light emitting elements are to be employed to illuminate a single segment of the display, those light emitting elements are arranged in a channel formed in the shroud such that there is no sloped partition or wall in the channel separating the light emitting elements. If only two light emitting elements are used, the elements are disposed in the channel such that they are nearer to the ends of the channel than to each other. If more than two light emitting elements are used per segment, the elements at the ends of the channel are nearer to the end of the channel than to their adjacent light emitting elements.

These arrangements are made because it was discovered that when a wall was used to separate light emitting elements the wall detracted from the sense of a continuously illuminated display. Further, because the human eye senses intensity variation, it was found that placing the end light emitting elements nearer to the end of the segment than to its adjacent light emitting element created the impression of a more uniformly illuminated display. If a separating wall were placed in between the unevenly spaced light emitting elements it was found that the human eye sensed an even less uniformly illuminated display.

The printed circuit board and the optical frame or shroud are mutually adapted for mating in a fixed relationship. A convenient adaptation is to utilize posts projecting outwardly from the frame which fit into apertures formed in the printed circuit board. The posts may be deformed after mating with the board to hold the two in a fixed relationship and to allow removal for repairs.

The optical frame is generally formed of a light colored or white material to be reflective. The channels in the frame have side and end walls which are planar surfaces formed at an angle to the top and bottom surfaces of the frame so that the surface of the frame farther from the printed circuit board has a channel perimeter larger than the channel perimeter nearer to the printed circuit board. A filter plate is fitted over the frame member. The filter plate may have its surface inscribed with notations or descriptions which help the viewer interpret the meaning of the display. The frame member and the filter plate are fixedly connected together. The frame member may have an adhesive deposit on one surface for attaching the filter plate to the optical frame.

DESCRIPTION OF THE INVENTION

Figure 1:
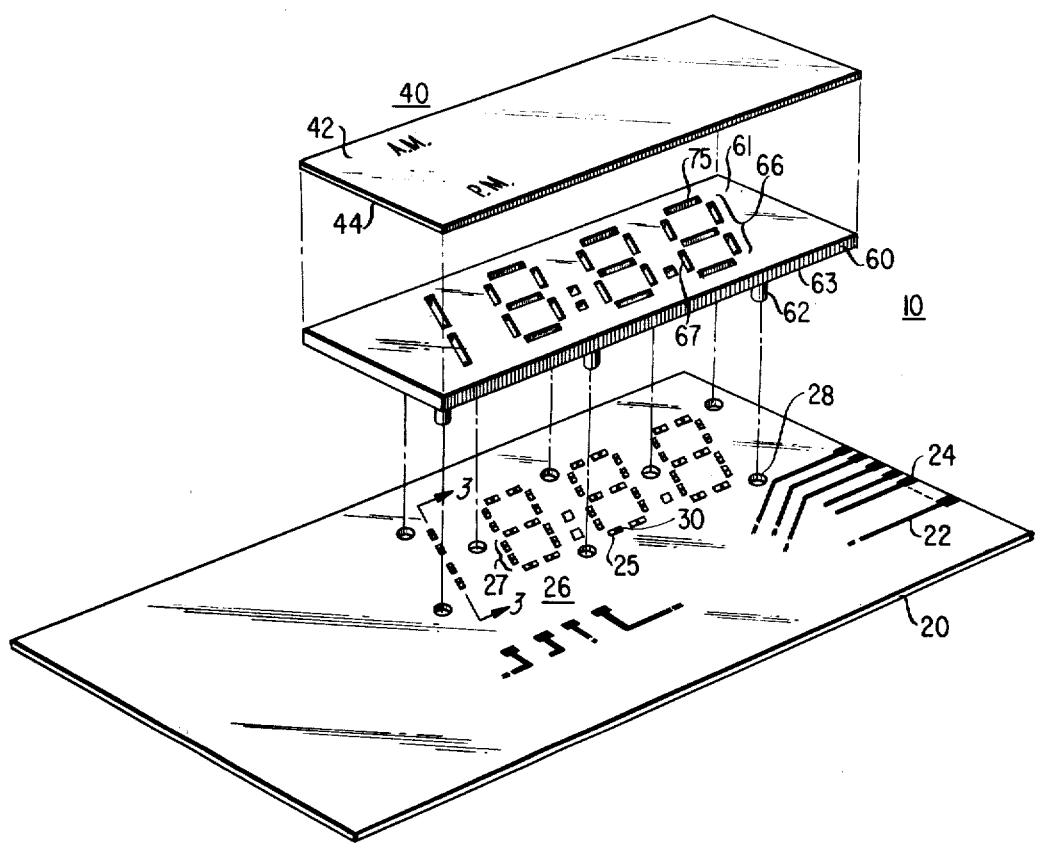
FIG. 1 shows an exploded perspective view of an embodiment of the present invention.

Turning now to FIG. 1 there is shown generally by the numeral 10 an exploded view of a display device for a four digit digital device. The number of digits and their arrangement may be altered as needed for the specific application.

A base member 20 is shown as a printed circuit board but could be other types of bases having elements for providing signal inputs to the light emitting member 30, shown as light emitting diodes (L.E.D.). The conducting surfaces 22 connect the L.E.D.'s to pads 24, shown enlarged in FIG. 2, for interconnection to the driving circuit in the well known manner.

Figure 2:
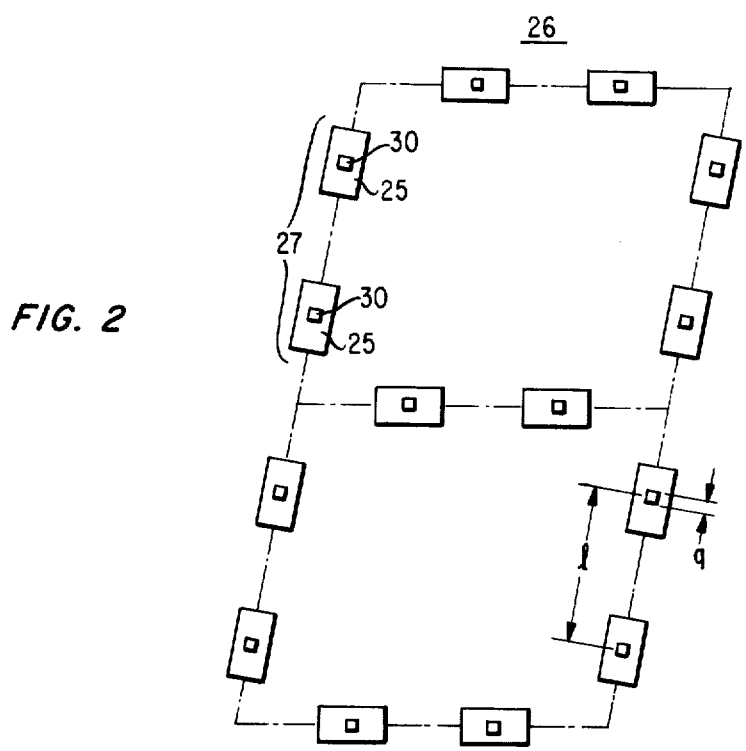
FIG. 2 shows an enlarged top view of a portion of the circuit board FIG. 1 partially broken away and in section.
Figure 3:
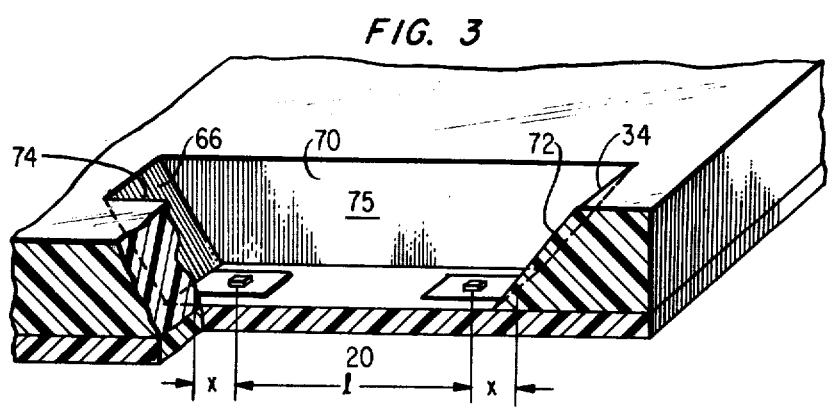
FIG. 3 is a perspective view of a portion of FIG. 1 partially broken away and in section.

In order to obtain a digital display for other numbers or letters (alphanumeric display) a simple seven segment array is shown by numeral 26 is employed. Each segment has a conductivity or pad pattern appropriate to properly bias and drive the light emitting elements bonded to it. Where L.E.D.'s are used each segment 27 has two pad pairs to drive the L.E.D. into emission or keep it off. FIG. 2 illustrates a pad pair as a single pad 25.

Figure 4:
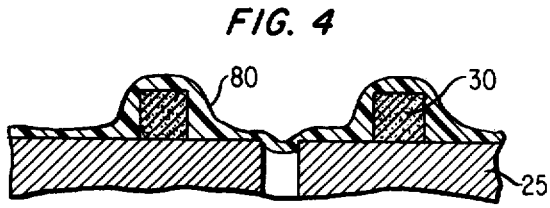
FIG. 4 shows a sectional view of a portion of FIG. 1 taken along the line 3—3 as shown in FIG. 1.

The board 20 has a plurality of mating members 28 shown as apertures, to be connected to post members 62 for fixedly connecting the frame 60 to the board 20. Prior to that assembly step the L.E.D.'s 30 are bonded to make electrical and mechanical contact with the board 20. A plastic coating 80 is deposited over the L.E.D.'s 30 as shown in FIG. 4 to seal them and to provide an optical refractive index between that of the L.E.D. itself and air to enhance light transmission.

An optical frame or shroud 60 has segment patterns 66, with segments 67, generally matched to those patterns 26 formed on the board 20.

When a display larger than ½ inch was desired it was common to consider using more than one L.E.D. per segment 27. When that was desired each segment 67 in the frame was partitioned by sloped walled sections so that each L.E.D. was centered in its own four wall chamber. In the present invention, two or more L.E.D.'s are used per segment with no sloped partition therebetween. The drawings only show two L.E.D.'s per segment, but more than two can be used. When two are used, the L.E.D.'s are separated by a distance l and are spaced from the ends of the segment 27 by a distance $x$ such that l is greater than $x$. There is no wall formed in the frame 60 to separate L.E.D.'s 30 as shown in FIG. 4. If more than two L.E.D.'s are used per segment 27 each L.E.D. would be separated by a distance l and the L.E.D. on the end of the array would be spaced apart from that end by a distance $x$ in which $x$ would be smaller than l. Naturally the pads would be similarly spaced to enable appropriate electrical drive to the light emitting members.

The frame member 60 has upper and lower surfaces 61 and 63 respectively. Each segment 67 has four walls 66, 70, 72 and 74. Each wall is a planar member interconnecting surfaces 61 and 63 such that the perimeter on surface 61 is larger than the perimeter on surface 63. The wall members 66, 70, 72 and 74 form a section of a pyramid creating a channel 75 which reflects the light from the L.E.D.'s 30 to the observer. The frame member 60 may be formed from a white or other light colored material to be an efficient reflector of light.

A filter plate 40 is a translucent material which may have an adhesive surface 44 formed thereon for enabling it to be fixed to the frame member 60. The outer surface 42 of the filter plate has notations thereon to help any viewer interpret the display.

In looking at the device as a finished assembly, an observer will see the corners of the segments 67 brightly lighted because of the placing of the L.E.D.'s nearer to the end walls 70 and 74 thus giving the effect of more evenly illuminated segments than is achieved by placing each L.E.D. in its own four walled channel. Further, each L.E.D. can be replaced easily should a failure occur during manufacture because the device can be readily disassembled. Because of the simplicity of the structure, the risk of causing failures during manufacture is greatly reduced.

I claim:

1. A display device comprising:
    a frame member having a channel formed therein;
    first and second solid state light emitting members arranged in said channel;
    said channel having only first and second end walls;
    said first and second light emitting members being fixed in spaced apart positions in a manner to define first and second spacings with said first and second end walls respectively and a third spacing between said members;
    said third spacing being larger than either said first or second spacing.
2. A display device in accordance with claim 1 wherein said first and second spacings are equal.
3. A display device in accordance with claim 2 including a plurality of said channels arranged at angles to one another to form adjacent closed loops, electrical means for activating the elements selected to form a display.
4. A display device in accordance with claim 1 wherein said frame includes first and second channels arranged at an angle to each other and forming a corner thereby.
5. A display device in accordance with claim 1 wherein:
    said solid state light emitting members have length
    said channel has length; and, said channel length is at least more than twice the length of said light emitting members.
6. The device claimed in claim 1 including further:
    a circuit board means;
    said circuit board means having bonding pads and first aligning members formed thereon; said frame member having aligning apertures;
    said frame member having second aligning members formed thereon for mating with said aligning apertures;
    said light emitting members disposed at least in groups of two at a spacing l and having a length $q$; and,
    each of said channels having an uninterrupted channel length greater than $l + q$.
7. The device claimed in claim 6 wherein:
    said first aligning members are apertures and,
    said second aligning members are mounting posts.
8. The device claimed in claim 7 wherein:
    said light emitting members comprise light emitting diodes.

9. The device claimed in claim 8 wherein:
said light emitting diodes have a light transmitting coating thereon.

10. The device claimed in claim 1 wherein:
said channel has thickness; said thickness formed by a plurality of straight wall members extending from said channel;
each of said wall members having a single planar surface.

11. The device claimed in claim 10 including further:
a filter plate member adapted to fit over said frame member and said channels for forming a visual contrast with said frame member such that said light emitting members will appear brighter when energized.

* * * * *